United States Patent
Dillon et al.

(10) Patent No.: US 7,800,936 B2
(45) Date of Patent: Sep. 21, 2010

(54) LATCH-BASED RANDOM ACCESS MEMORY

(75) Inventors: Michael Norris Dillon, Richfield, MN (US); James Arnold Jensen, Eagan, MN (US); Bret Alan Oeltjen, Elko, MN (US)

(73) Assignee: LSI Logic Corporation, Milpitas, CA (US)

( * ) Notice: Subject to any disclaimer, the term of this patent is extended or adjusted under 35 U.S.C. 154(b) by 136 days.

(21) Appl. No.: 12/168,277

(22) Filed: Jul. 7, 2008

(65) Prior Publication Data

US 2010/0002526 A1  Jan. 7, 2010

(51) Int. Cl.
*G11C 11/00* (2006.01)

(52) U.S. Cl. .................. 365/154; 365/189.05; 365/195

(58) Field of Classification Search .................. 365/154, 365/189.05, 195, 230.06, 189.01, 189.11, 365/230.05, 230.03
See application file for complete search history.

(56) References Cited

U.S. PATENT DOCUMENTS

| 5,337,287 | A | * | 8/1994 | Nishikawa | ............. 365/189.16 |
| 5,353,251 | A | | 10/1994 | Uratani et al. | |
| 5,384,734 | A | * | 1/1995 | Tsujihashi et al. | ...... 365/189.04 |
| 5,805,496 | A | | 9/1998 | Batson et al. | |
| 6,075,721 | A | | 6/2000 | Runaldue et al. | |
| 2007/0096713 | A1 | * | 5/2007 | Perner | ........................ 323/316 |
| 2007/0247897 | A1 | * | 10/2007 | Katti | ........................ 365/158 |

OTHER PUBLICATIONS

Oeltjen, Silicon Optimization FS 2.0 Latch Based Ram App Note, Oct. 2000, pp. 1-9, by LSI Logic Corp.

* cited by examiner

*Primary Examiner*—Dang T Nguyen

(57) ABSTRACT

A latch-based integrated circuit random access memory having selectable bit write capability that is less susceptible to disturbing data stored in unselected bits during write operations by utilizing an inhibit signal to block writing of the unselected bits.

21 Claims, 2 Drawing Sheets

10

LATCH-BASED RANDOM ACCESS MEMORY

TECHNICAL FIELD

The present invention relates to integrated circuit memories generally, and, in particular, to integrated circuit latch-based random access memories.

BACKGROUND

Replacing small (e.g., less than 4096 bit) traditional static random access memories (SRAM) with latch-based random access memories (LBRAM) may, in certain circumstances, relax restrictions on the layout of circuitry on an integrated circuit (chip). LBRAM is typically implemented with logic gates and does not have sense amplifiers, pre-charge circuitry, and other circuitry traditionally found in an SRAM. Advantageously, LBRAM designs can be based on the same logic architecture as on the rest of the chip, resulting in the memory circuitry having the same "pitch" or layout spacing as in the other logic circuitry. This allows for the routing of data signals through the LBRAM design (by exploiting routing "channels" or spaces within the memory layout) with the same flexibility as routing the signals through the logic circuitry, unlike SRAM designs which have more restrictions on the placing and routing of signals though the SRAM layout. Hence, LBRAMs are implemented in application specific integrated circuits (ASIC) and other complex chips at relatively low cost compared to SRAM designs. Moreover, LBRAM designs may be at least as fast, if not faster, than SRAM designs.

Latch-based memories are generally arranged to have an M word by N bits per word configuration. While the N bits at a time are typically read at a time (i.e., in parallel) from the LBRAM, it may be desirable to write less than N bits at a time into the LBRAM. Some LBRAM designs allow for less than all of the N bits to be written in a selected word without disturbing the remaining bits in the selected word. However, these designs have been found to be problematic, especially as the number of words (M) in the LBRAMs get larger (e.g., M >=1024). Such designs typically use-N write data lines to transmit data to be written to the M memory cells coupled to each of the write data lines. When data is to be written into certain memory cells, data is asserted on the corresponding write data lines by placing those data lines in a low impedance state having logic values representing the desired data value (e.g., a "zero" or a "one"). Conversely, when data is not to be written into certain memory cells, no data is asserted on the corresponding write address lines and the lines are left in a high-impedance state. Then, the N memory cells of a selected word are enabled (in a typical memory cell, a switch in the memory cell couples a bistable latch in the cell to the corresponding write data line when the cell is enabled), and the enabled memory cells coupled to the low impedance write data lines are "forced" to store the data value on the corresponding write data line (i.e., the memory cells are overwritten with the data value on the corresponding write data line). In theory, enabled memory cells coupled to the high impedance write data lines will retain the data stored therein. However, because the write data lines may have significant capacitive loading, when the enabled memory cell is coupled to the high-impedance write data line, the data stored in the cell may unintentionally change state.

SUMMARY

In one embodiment, the present invention is a memory comprising an array of memory cells arranged in N rows of memory cells and M columns of memory cells, M write select lines coupling to corresponding columns of memory cells, N write data lines coupling to corresponding rows of memory cells, a write address decoder adapted to enable a selected one of the write select lines in response to a write address, and N gating circuits. Each gating circuit is adapted to selectively assert a data signal or an inhibit signal to a corresponding one of the write data lines in response to a corresponding write select signal. Further, each data signal has a value, and at least one of the memory cells is adapted, when a corresponding write select line is enabled, to store the data signal value when the data signal is present on a corresponding write data line and to retain the data stored therein when the inhibit signal is present on the corresponding write data line.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

Figure 1:
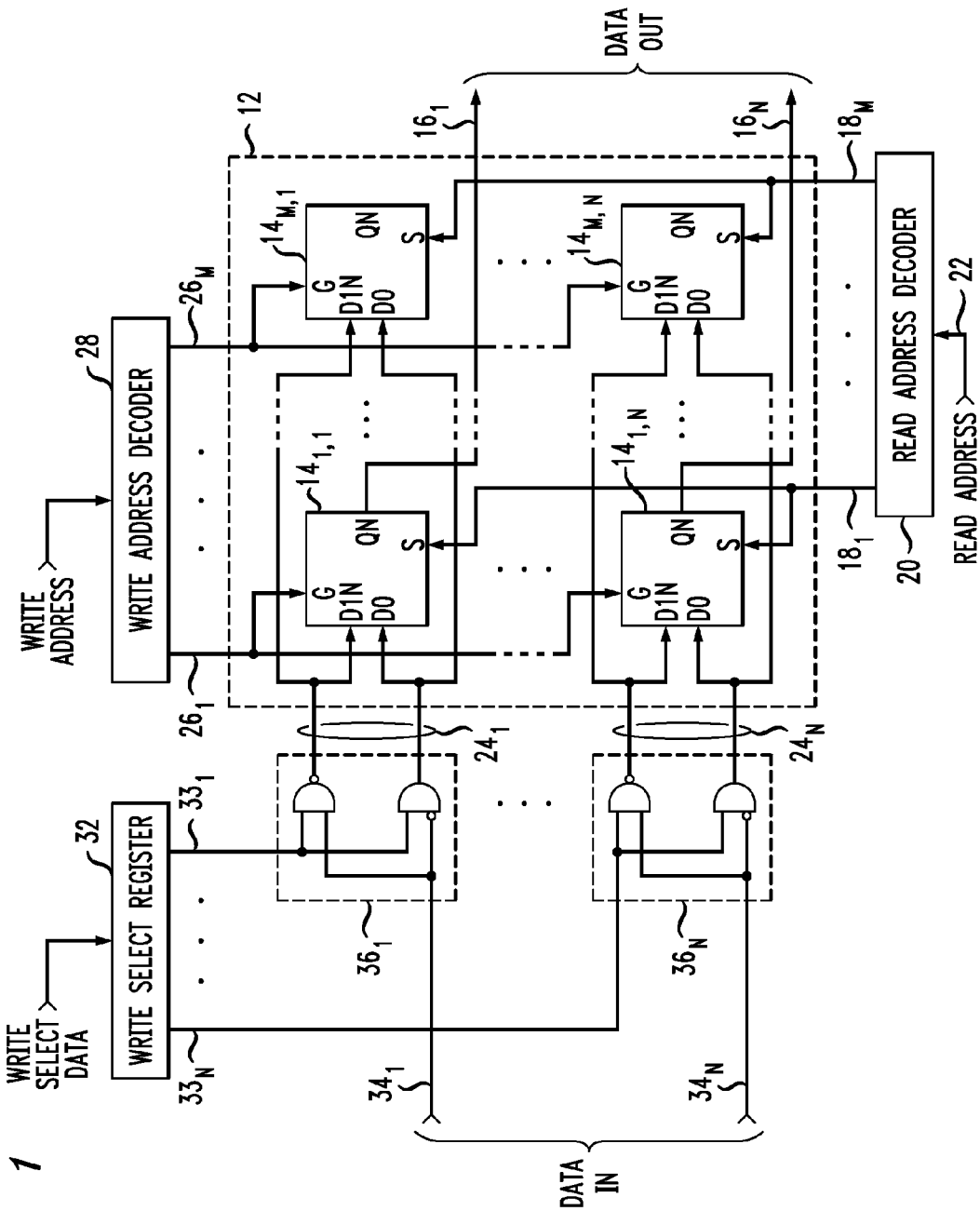
FIG. 1 is a simplified block diagram of an exemplary latch-based random access memory (LBRAM) according to one embodiment of the invention.

Referring to FIG. 1, a simplified block diagram of an exemplary latch-based random access memory (LBRAM) 10 is shown in accordance with an exemplary embodiment of the invention. The memory 10 comprises an array of memory cells 12 arranged into M columns of memory cells and N rows of memory cells. The memory cells $14_{1,1}$-$14_{M,N}$ will be described in more detail in connection with FIGS. 2 and 3.

Data is read from selected columns of memory cells $14_{K,1}$-$14_{K,N}$ ($1 \leq K \leq M$) onto corresponding bit lines $16_1$-$16_N$ when the memory cells $14_{K,1}$-$14_{K,N}$ are enabled for a read operation in response to an enabled one of the read select lines $18_1$-$18_M$. A conventional read address decoder 20 enables one of the lines $18_1$-$18_M$ in response to a read address signal 22. Details on how the enabled memory cells operate will be described in detail below in connection with FIGS. 2 and 3; for purposes here, each memory cell has a bistable latch that stores a data value and when a cell is enabled for a read operation (i.e., when the stored data value is to be read from the enabled cell), a switch in the cell couples the bistable latch to the corresponding bit line.

Data to be written to selected columns of memory cells $14_{J,1}$-$14_{J,N}$ ($1 \leq J \leq M$) is coupled to the memory cells via write data lines $24_1$-$24_N$. As explained in more detail below, each line $24_1$-$24_N$ comprises a pair of conductors which convey a data signal or an inhibit signal to the memory cells coupled thereto. Assuming, for purpose here, data signals are present on all of the N write data lines, the data values (e.g., a "one" or a "zero") of the data signals are written into the column of N memory cells $14_{J,1}$-$14_{J,N}$ when the memory cells in the column are enabled in response to an enabled one of the corresponding write select lines $26_1$-$26_M$. A conventional write address decoder 28 enables one of the lines $26_1$-$26_M$ in response to a write address decoder signal 30. Again, details on how the enabled memory cells operate will be described in detail below in connection with FIGS. 2 and 3; for purposes here, when a cell is enabled for a write operation, a switch in the cell couples the data signal (when present) to the bistable latch in the cell, overwriting data in the latch.

Should it be desirable to not write all of the N enabled memory cells $14_{J,1}$-$14_{J,N}$ a subset of the N enabled memory cells may be written to while the remaining cells retain the data stored therein. As will be explained in more detail in connection with FIGS. 2 and 3, each enabled memory cell that receives an inhibit signal instead of a data signal will retain the data stored therein. Selection of which ones of the N enabled memory cells are to be written to, in this embodiment, is determined by the contents of N-bit write select register 32. Write select signals $33_1$-$33_N$ from the register 32 are combined with signals on input data lines $34_1$-$34_N$ in gating circuits $36_1$-$36_N$ to assert data signals or an inhibit signals onto corresponding write data lines $24_1$-$24_N$. Each of the gating circuits $36_1$-$36_N$ produces, in this example and explained in more detail in connection with FIG. 2, one of four possible combinations of low impedance logic values on the pair of conductors of the corresponding write data lines $24_1$-$24_N$. In this embodiment, each gating circuit $36_1$-$36_N$ generates an inhibit signal on the corresponding write data line $24_1$-$24_N$ if a corresponding bit in register 32 is set. For each bit in register 32 that is reset, the corresponding gating circuit $36_1$-$36_N$ generates data signals on corresponding write data lines $24_1$-$24_N$ in response to signals on corresponding input data lines $34_1$-$34_N$. It is understood that the logic circuitry shown in the gating circuits $36_1$-$36_N$ is illustrative of the functionality of the gating circuits and other implementations may be used.

Figure 2:
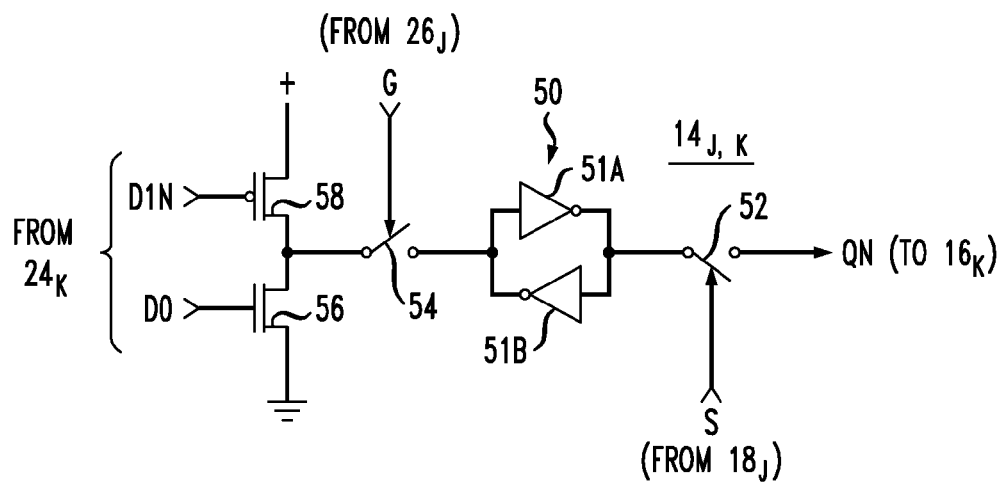
FIG. 2 is a simplified schematic diagram of an exemplary memory cell for the LBRAM of FIG. 1, according to another embodiment of the invention.

One embodiment of one exemplary memory cell $14_{J,K}$ ($1 \leq J \leq M$, $1 \leq K \leq N$) is shown in FIG. 2. Here, a bistable latch 50 has two CMOS inverters 51A, 51B coupled together to form a regenerative feedback loop. During a read of the memory cell, switch 52 (when the corresponding read select line $18_J$ is enabled, as described above) couples the latch 50 to the corresponding bit line $16_K$ via output QN.

During a write to the memory cell, switch 54 (when corresponding write select line $26_J$ is enabled as discussed above, resulting in the memory cell becoming "enabled") couples n-MOS and p-MOS transistors 56, 58, respectively, to latch 50 such that data on corresponding write data line $24_K$, from inputs D1N, D0, is written into the latch 50. If data is to be written into the latch 50 (assuming switch 54 is closed), one of the transistors 56, 58 is conducting, thereby coupling the input of inverter 51A to either ground via transistor 56 or to a power source through transistor 58. As will be explained below, current flowing in the series combination of switch 54 with either transistor 56 or 58 on will "overcome" the output of inverter 51B to write the data value into the latch and, when switch 54 opens, the feedback loop of latch 50 is restored and the written data retained. If, however, no data is to be written to the enabled cell $14_{J,K}$, then both transistors 56, 58 are nonconductive. To keep transistors 56, 58 nonconductive, an inhibit signal is generated by the corresponding gating circuit $36_K$ (FIG. 1).

In this example, if a data signal on write data line $24_K$ is asserted resulting in the inputs D1N, D0 to be both "one" (D0="one" and D1N="one"), then transistor 56 is on and a data value of "zero" is written into the latch 50 (in this example, the logic value on output QN is the inverse of the data value stored in the latch 50). Instead, if a data signal on write data line $24_K$ is asserted resulting in D1N="zero" and D0="zero," then transistor 58 is turned on and a data value of "one" is written into latch 50. If, however, an inhibit signal is present (D0="zero" and D1N="one"), then both transistors are off and the data value in the latch 50 is unchanged because a no current is forced into or from the latch 50. Because the transistors 56, 58 are disposed in series between a power supply and ground, it is not desirable for both transistors to be on simultaneously for any significant period of time, e.g., having D0="one" and D1N="zero."

Figure 3:
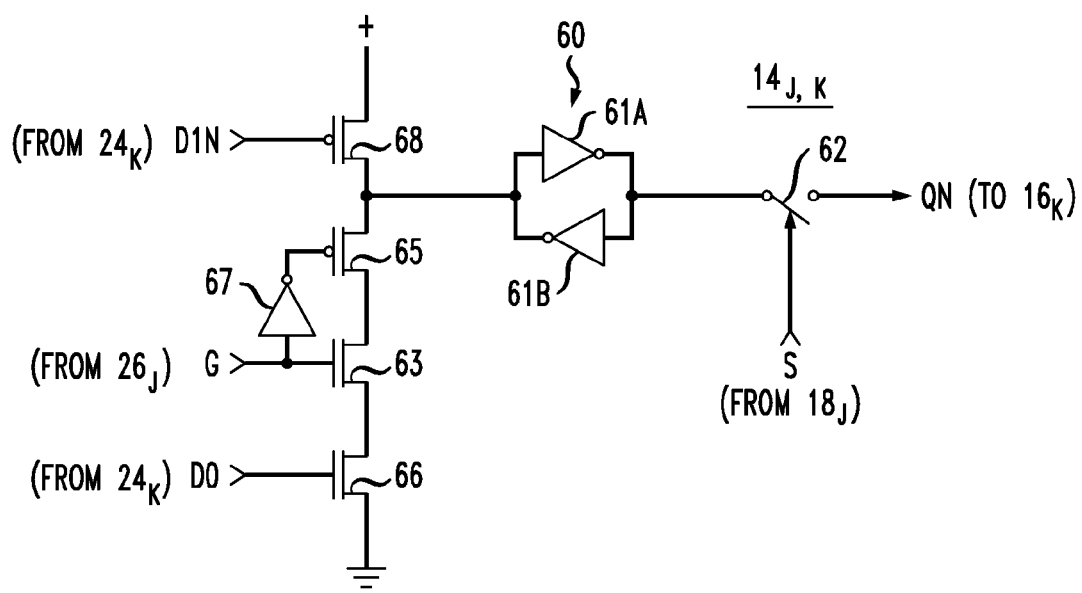
FIG. 3 is a simplified schematic diagram of an alternative exemplary memory cell for the LBRAM of FIG. 1, according to still another embodiment of the invention.

An alternative embodiment of the memory cell $14_{J,K}$ is shown in FIG. 3. For reading data out of bistable latch 60, a switch 62 is provided. Operation of the switch 62 is the same as described above in connection with switch 52. However, instead of switch 54 of FIG. 2, transistors 63 (here an n-MOSFET) and 65 (here a p-MOSFET) are provided such that both transistors turn on when the corresponding write select line $26_J$ is enabled. Inverter 67 provides the correct logic value to the control terminal (gate) of transistor 65 such that both transistors 63, 65 are both off or both on. (Alternatively, inverter 67 could be "turned around" to drive the control terminal (gate) of transistor 63 from control signals applied to the gate of transistor 65.) Transistors 66, 68 correspond to transistors 56, 58, respectively, in FIG. 2 and operate the same as described above.

Because of the feedback loop of the latch 50 (60), the latch may not have a unique input and a unique output. Thus, switch 52 (62) may couple either output of the inverters 51A, 51B (61A, 61B). Similarly, switch 54 (transistors 63, 65) may couple to either input of the inverters 51A, 51B (61A, 61B) and may be coupled to the same node in latch 50(60) to which switch 52 (62) is coupled. Therefore, the input and output of the bistable latch may be one in the same and the terms used interchangeably.

In this embodiment, switches 52, 54, 62 are conventional transmission gates although each switch may be a single transistor (e.g., an n-MOSFET) instead.

To be able to force the bistable latch 50 to change states, the sizes of transistors (not shown) within the inverter 51B (also referred to generally as the "size" of the inverter 51B) are smaller than transistors (not shown) in the switch 54 and the transistors 56, 58. This allows either transistors 56, 58 through switch 54 to overcome inverter 51B. Also, the inverter 51A may be larger than inverter 51B. Similarly, the sizes of transistors (not shown) within the inverter 61B are smaller than transistors 63, 65, 66, 68. Also, the inverter 61A may be larger than inverter 61B.

Advantageously, by using an inhibit signal on the write data lines instead of placing them in a high-impedance state when data is not to be written into certain ones of the memory cells that are instead to retain the data stored therein, those cells are unlikely to have the data stored therein disturbed (i.e., unintentionally change) during a write to the memory 10.

It is understood that while the embodiment shown herein is a memory for an ASIC, the invention may be used in any application where small, high-speed memories are desired, e.g., in microprocessors, FPGAs, etc.

For purposes of this description and unless explicitly stated otherwise, each numerical value and range should be interpreted as being approximate as if the word "about" or "approximately" preceded the value of the value or range. Further, signals and corresponding nodes, ports, inputs, or outputs may be referred to by the same name and are interchangeable. Additionally, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

It is understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A memory comprising:
    an array of memory cells arranged in N rows of memory cells and M columns of memory cells;
    M write select lines coupling to corresponding columns of memory cells;
    N write data lines coupling to corresponding rows of memory cells;
    a write address decoder adapted to enable a selected one of the write select lines in response to a write address; and
    N gating circuits, each gating circuit adapted to selectively assert a data signal or an inhibit signal to a corresponding one of the write data lines in response to a corresponding write select signal;
    wherein each data signal has a value, and wherein at least one of the memory cells is adapted, when a corresponding write select line is enabled, to store the data signal value when the data signal is present on a corresponding write data line and to retain the data stored therein when the inhibit signal is present on the corresponding write data line, and
    wherein each of the write data lines comprises a pair of conductors, each gating circuit being adapted to assert one of two logic values on each conductor of the pair of conductors of a corresponding write data line to form logic value combinations thereon, the data signal on a write data line being at least one of a first group of the logic value combinations, and the inhibit signal on the write data line being at least one of a second group of the logic value combinations, the first group of the logic value combinations being different from the second group of the logic value combinations.

2. The memory of claim 1, further comprising:
    M read select lines coupling to corresponding columns of memory cells;
    N bit lines coupling to corresponding rows of memory cells; and
    a read address decoder adapted to enable a selected one of the read select lines in response to a read address;
    wherein data stored in a column of memory cells is coupled to corresponding bit lines in response to the enabled read select line.

3. The memory of claim 1, further comprising:
    an N-bit write select register adapted to generate the write select signals.

4. The memory of claim 1, wherein the data signal and the inhibit signal have a low impedance.

5. The memory of claim 1, wherein having same logic values on each conductor of the pair of conductors is the first group of the logic value combinations and having different logic values on each conductor of the pair of conductors is the second group of the logic value combinations.

6. The memory of claim 5, wherein each memory cell in the array of memory cells comprises:
    a bistable latch having an input;
    a first switch adapted to selectively couple a node to the input of the bistable latch when the corresponding write select line is enabled;
    a first transistor having a control terminal coupled to a first conductor of the pair of conductors of the corresponding write data line, a first output terminal coupled to the node, and a second output terminal coupled to a first voltage node; and
    a second transistor having a control terminal coupled to a second conductor of the pair of conductor of the corresponding write data line, a first output terminal coupled to the node, and a second output terminal coupled to a second voltage node.

7. The memory of claim 6, wherein the memory further comprises:
    M read select lines coupling to corresponding columns of memory cells;
    N bit lines coupling to corresponding rows of memory cells; and
    a read address decoder adapted to enable a selected one of the read select lines in response to a read address;
    wherein for each memory cell of the array of memory cells the bistable latch has an output, and wherein each of the memory cells of the array of memory cells further comprises:
    a second switch adapted to couple the output of the bistable latch to a corresponding bit line when a corresponding read select line is enabled.

8. The memory of claim 7, wherein the bistable latch comprises cross-coupled inverters, the first and second transistors are MOS transistors, the first and second switches are transmission gates, the first voltage node is a ground node, and the second voltage node is a power supply node.

9. The memory of claim 6, wherein bistable latch comprises cross-coupled inverters, one of the inverters being weaker than the other, the weaker inverter having an output coupled to the input of the bistable latch.

10. The memory of claim 5, wherein each memory cell comprises:
    a bistable latch having an input;
    a first pair of series-coupled transistors coupled between a first voltage node and the input of the bistable latch, one transistor of the first pair of transistors having a control terminal coupled to a first conductor of the pair of conductors of a corresponding write data line and the other transistor of the first pair of transistors having a control terminal coupled to the corresponding write select line; and a second pair of series-coupled transistors coupled between a second voltage node and the input of the bistable latch, one transistor of the second pair of transistors having a control terminal coupled to a second conductor of the pair of conductors the corresponding write data line and the other transistor of the second pair of transistors having a control terminal coupled to the corresponding write select line.

11. The memory of claim 10, wherein the memory further comprises:
   M read select lines coupling to corresponding columns of memory cells;
   N bit lines coupling to corresponding rows of memory cells; and
   a read address decoder adapted to enable a selected one of the read select lines in response to a read address;
   wherein for each memory cell of the array of memory cells the bistable latch has an output, and wherein each of the memory cells of the array of memory cells further comprises:
   a switch adapted to couple the output of the bistable latch to a corresponding bit line when a corresponding read select line is enabled.

12. The memory of claim 11, wherein the bistable latch comprises cross-coupled inverters, first and second pairs of series-coupled transistors are MOS transistors, the switch is a transmission gate, the first voltage node is a ground node, and the second voltage node is a power supply node.

13. The memory of claim 10, wherein the bistable latch comprises cross-coupled inverters, one of the inverters being weaker than the other, the weaker inverter having an output coupled to the input of the bistable latch.

14. The memory of claim 10, wherein the bistable latch further comprises an inverter disposed between the corresponding write select line and the control terminal of the second pair of transistors coupling to the corresponding write select line.

15. A memory comprising:
   an array of memory cells arranged in N rows of memory cells and M columns of memory cells;
   M write select lines coupling to corresponding columns of memory cells;
   N write data lines coupling to corresponding rows of memory cells, each of the write data lines comprising a pair of conductors;
   M read select lines coupling to corresponding columns of memory cells;
   N bit lines coupling to corresponding rows of memory cells;
   a write address decoder adapted to enable a selected one of the write select lines in response to a write address;
   a read address decoder adapted to enable a selected one of the read select lines in response to a read address;
   N gating circuits, each gating circuit in response to a corresponding write select signal is adapted to selectively assert a data signal having same logic values on each conductor of the pair of conductors of a corresponding write data line, or an inhibit signal having different logic values on each conductor of the pair of conductors of the corresponding write data line;
   wherein each data signal has a value, and wherein at least one of the memory cells is adapted, when a write select line corresponding to the at least one memory cell is enabled, to store the data signal value when the data signal is present on a corresponding write data line and to retain the data stored therein when the inhibit signal is present on the write data line corresponding to the at least one memory cell.

16. The memory of claim 15, wherein each memory cell in the array of memory cells comprises:
   a bistable latch having an input and an output;
   a first switch adapted to selectively couple a node to the input of the bistable latch when the corresponding write select line is enabled;
   a first transistor having a control terminal coupled to a first conductor of the pair of conductors of the corresponding write data line, a first output terminal coupled to the node, and a second output terminal coupled to a first voltage node;
   a second transistor having a control terminal coupled to a second conductor of the pair of conductor of the corresponding write data line, a first output terminal coupled to the node, and a second output terminal coupled to a second voltage node; and
   a second switch adapted to couple the output of the bistable latch to the corresponding bit line when the corresponding read select line is enabled.

17. The memory of claim 16, wherein the bistable latch comprises cross-coupled inverters, first and second pairs of series-coupled transistors are MOS transistors, the switch is a transmission gate, the first voltage node is a ground node, and the second voltage node is a power supply node.

18. The memory of claim 16, wherein bistable latch comprises cross-coupled inverters, one of the inverters being weaker than the other, the weaker inverter having an output coupled to the input of the bistable latch.

19. The memory of claim 15, wherein each memory cell comprises:
   a bistable latch having an input and an output;
   a first pair of series-coupled transistors coupled between a first voltage node and the input of the bistable latch, one transistor of the first pair of transistors having a control terminal coupled to a first conductor of the pair of conductors of the corresponding write data line and the other transistor of the first pair of transistors having a control terminal coupled to the corresponding write select line; and
   a second pair of series-coupled transistors coupled between a second voltage node and the input of the bistable latch, one transistor of the second pair of transistors having a control terminal coupled to a second conductor of the pair of conductors of the corresponding write data line and the other transistor of the second pair of transistors having a control terminal coupled to the corresponding write select line; and
   a switch adapted to couple the output of the bistable latch to a corresponding bit line when a corresponding read select line is enabled.

20. The memory of claim 19, wherein the bistable latch comprises cross-coupled inverters, first and second pairs of series-coupled transistors are MOS transistors, the switch is a transmission gate, the first voltage node is a ground node, and the second voltage node is a power supply node.

21. The memory of claim 19, wherein bistable latch comprises cross-coupled inverters, one of the inverters being weaker than the other, the weaker inverter having an output coupled to the input of the bistable latch.

* * * * *